United States Patent
Chakravarthi et al.

(10) Patent No.: US 6,797,593 B2
(45) Date of Patent: Sep. 28, 2004

(54) METHODS AND APPARATUS FOR IMPROVED MOSFET DRAIN EXTENSION ACTIVATION

(75) Inventors: Srinivasan Chakravarthi, Richardson, TX (US); Amitabh Jain, Richardson, TX (US); Xin Zhang, Plano, TX (US)

(73) Assignee: Texas Instruments Incorporated, Dallas, TX (US)

( * ) Notice: Subject to any disclaimer, the term of this patent is extended or adjusted under 35 U.S.C. 154(b) by 15 days.

(21) Appl. No.: 10/243,610

(22) Filed: Sep. 13, 2002

(65) Prior Publication Data

US 2004/0053481 A1 Mar. 18, 2004

(51) Int. Cl.[7] ............................................. H01L 21/425
(52) U.S. Cl. ........................ 438/514; 438/530; 438/527
(58) Field of Search ................................. 438/514, 527, 438/530, 303, 529

(56) References Cited

U.S. PATENT DOCUMENTS

| | | |
|---|---|---|
| 5,424,229 A | 6/1995 | Oyamatsu |
| 5,648,286 A | 7/1997 | Gardner et al. |
| 5,719,425 A | 2/1998 | Akram et al. |
| 5,793,090 A | 8/1998 | Gardner et al. |
| 5,923,982 A | 7/1999 | Kadosh et al. |
| 6,078,080 A | 6/2000 | Kadosh et al. |
| 6,268,253 B1 * | 7/2001 | Yu .............................. 438/303 |
| 2003/0049917 A1 * | 3/2003 | Noda ......................... 438/527 |

OTHER PUBLICATIONS

S. Wolf, "Silicon Processing for the VLSI Era, vol. 3", Lattice Press, California(1995)pp. 310–344,313.*

* cited by examiner

*Primary Examiner*—Caridad Everhart
(74) *Attorney, Agent, or Firm*—Yingsheng Tung; Wade James Brady, III; Frederick J. Telecky, Jr.

(57) ABSTRACT

Methods are described for fabricating MOS type transistors, in which multiple drain extension implants are performed using different dopant species of the same type. The implanted drain extension dopants are activated using separate anneal processes to provide active dopants of both species throughout the drain extension regions adjacent the transistor channel.

27 Claims, 15 Drawing Sheets

METHODS AND APPARATUS FOR IMPROVED MOSFET DRAIN EXTENSION ACTIVATION

FIELD OF INVENTION

The present invention relates generally to semiconductor devices and more particularly to methods for implanting and activating dopants in transistor drain extensions in the manufacture of semiconductor products.

BACKGROUND OF THE INVENTION

MOS transistors are found in many modern semiconductor products where switching and/or amplification functions are needed. Many manufacturing processes and techniques have been developed for fabricating MOS devices in semiconductor substrate materials such as silicon and the like. In recent years, the size of transistors and other components have steadily decreased to submicron levels in order to facilitate higher device densities in semiconductor products. At the same time, many new applications have created a need to operate transistors and other semiconductor devices at lower power and voltage levels. Thus, whereas previous MOSFET devices were designed to operate at voltages of 5 or more volts, newer applications may require such devices to operate from DC supplies of around 3 volts or less. In addition, switching speed requirements of MOS transistors continue to increase in order to facilitate faster and improved product performance. Accordingly, efforts continue to be made to design semiconductor devices, such as MOSFET transistors, which occupy less physical space, consume less power, and operate at higher switching speeds and at lower voltages.

MOS transistors include a conductive gate overlying a channel region of the substrate with a thin gate dielectric, typically oxide, therebetween. Source and drain regions of the substrate (sometimes referred to as junction regions) are doped with impurities on opposite sides of the channel, wherein the source/drain regions of NMOS devices are doped with n-type impurities (e.g., As, Sb, P, etc.) and PMOS devices are doped using p-type impurities (e.g., B, Ga, In, etc.). The length of the gate structure overlying the channel is typically referred to as the physical channel length. The source and drain dopants are typically implanted into the silicon substrate using ion implantation systems, wherein the dosage and energy of the implanted ions may be varied depending upon the desired dopant concentration, depth, and profile. The ion dosage generally controls the concentration of implanted ions for a given semiconductor material, and the energy level of the beam ions determines the distance of penetration or depth of the implanted ions (e.g., the junction depth).

Following implantation, the dopant atoms in the source/drain regions occupy interstitial positions in the substrate lattice, and the dopant atoms must be transferred to substitutional sites to become electrically active. This process is sometimes referred to as "activation", and is accomplished by high temperature annealing in an inert ambient such as argon. The activation anneal process also causes diffusion of implanted dopant species downward and laterally in the substrate, wherein the effective channel length becomes less than the physical channel length. As device sizes continue to shrink, the physical and effective channel lengths continue to be scaled downward, wherein short channel effects become significant.

In addition to short channel effects, hot carrier effects are also experienced in short channel devices. For example, during saturation operation of a MOS transistor, electric fields are established near the lateral junction of the drain and channel regions. This field causes channel electrons to gain kinetic energy and become "hot". Some of these hot electrons traveling to the drain are injected into the thin gate dielectric proximate the drain junction. The injected hot carriers, in turn, often lead to undesired degradation of the MOS device operating parameters, such as a shift in threshold voltage, changed transconductance, changed drive current/drain current exchange, and device instability.

To combat channel hot carrier effects, drain extension regions are commonly formed in the substrate, which are variously referred to as double diffused drains (DDD), lightly doped drains (LDD), and moderately doped drains (MDD). These drain extension regions absorb some of the potential into the drain and away from the drain/channel interface, thereby reducing channel hot carriers and the adverse performance degradation associated therewith. Referring to FIG. 1, a conventional transistor fabrication process 2 is illustrated beginning at 4, wherein isolation structures are formed in a substrate at 6, and a gate oxide (e.g., gate dielectric) is formed at 8. At 10, a layer of polysilicon is deposited over the gate oxide, and is then patterned at 12 to form a polysilicon gate structure.

An LDD implant is performed at 14, wherein drain extension regions are implanted using As. Typically, the LDD implant at 14 is a fairly low concentration dopant implantation process, which uses the edge of the patterned gate structure as an implantation mask. Where As is used, a cap oxide layer is then formed over the substrate and gate structure at 16, which prevents As from diffusing outward from the silicon substrate during subsequent annealing. Spacers are then formed at 18 along the sidewalls of the gate structure, and a second implantation (e.g., sometimes called a "source/drain implant") is performed at 20 using a higher dopant concentration and implantation energy to form the source/drain junction regions.

An activation anneal is then performed at about 1050 degrees C. at 22 to activate the implanted As in the drain extensions and the source/drain regions, and also to cause diffusion or migration of As downward and laterally in the silicon. Thus, drain extension regions and source/drain regions are provided, which partially overlap one another in the substrate. Typically, the drain extension regions extend downward to a somewhat shallow depth and laterally to or under the gate structure, whereas the deeper source/drain regions are laterally spaced from the gate (e.g., by about the sidewall spacer width). The gate and source/drain regions are then silicided at 24 and back-end interconnect processing is performed at 26 before the method 2 ends at 28.

As a result of the two implantations at 14 and 20, a dopant gradient is established across the junction from the source/drain region of the junction to the drain extension region adjacent the channel, sometimes referred to as a graded junction. The drain extension region operates to assume a substantial portion of the entire voltage drop associated with saturation operation at the drain junction, while the more heavily doped source/drain region forms a low resistivity region suitable for enhanced contact conductivity. Further, the source/drain dose is implanted at a higher energy to produce deeper source/drain junctions and thereby to provide better protection against junction spiking.

Recently, lightly doped drain extensions have given way to moderately doped and highly doped drain extensions, wherein the drain extension depths are becoming smaller (e.g., shallower). The recent trend is toward shallower junctions with lower sheet resistance, wherein reducing sheet resistance facilitates higher drive currents (e.g., improved threshold voltage transistor performance), and faster switching times. Shallower junctions reduce short channel effects, facilitating continuing efforts at scaling MOS transistors to smaller and smaller dimensions, both lateral and vertical scaling. The amount of dopant activation in the drain extensions plays an important role in determining the sheet resistance thereof, wherein increasing the dopant activation (e.g., lowering the sheet resistance) serves to lower parasitic resistance within the source to drain path. Thus, there is a need for fabrication techniques for MOS type transistors, by which improved drain extension dopant activation can be facilitated in the manufacture of semiconductor devices.

SUMMARY OF THE INVENTION

The following presents a simplified summary in order to provide a basic understanding of one or more aspects of the invention. This summary is not an extensive overview of the invention, and is neither intended to identify key or critical elements of the invention, nor to delineate the scope thereof. Rather, the primary purpose of the summary is to present some concepts of the invention in a simplified form as a prelude to the more detailed description that is presented later. The invention relates to methods for MOS transistor fabrication, by which improved drain extension dopant activation may be achieved in both NMOS and PMOS type devices.

In one aspect of the invention, a first dopant species of a first type is implanted into a drain extension region of the substrate adjacent the channel via a first implantation process. As used hereinafter, the term drain extension includes extension regions associated with transistor drains as well as those associated with transistor sources. The implanted first dopant species is activated using a first anneal process. A second dopant species of the same type (e.g., n-type or p-type) is implanted into the drain extension region after the first anneal process using a second implantation process. The second dopant is then activated using a second anneal process. In one NMOS implementation illustrated and described below, the first and second dopants are different species of the same type, such as As (arsenic) and Sb (antimony) or P (phosphorus). PMOS implementations are also possible, for example, wherein the first dopant is B (boron) or $BF_2$ (boron difluoride) and the second dopant is In (indium).

In the NMOS example, the first anneal process can be carried out at about 1050 degrees C. to activate the As dopants, and the subsequent second activation anneal process is done at about 950 degrees C. to activate the implanted Sb dopants. The implantation of two different dopant species of the same type, along with separate activation anneal processes has been found to facilitate fabrication of ultra-shallow super active drain extension junctions, by which sheet resistances of about 270 ohms/square have been achieved at junction depths of about 200–250 Å. This aspect of the invention has thus been found to provide significant improvement in reducing sheet resistance compared with prior methods, such as illustrated in FIG. 1 above. The first and second anneal processes, moreover, may advantageously provide active first and second dopant species throughout substantially all of the drain extension region adjacent the channel region.

The formation of the source/drain regions may be integrated into this process, for example, wherein gate sidewall spacers are formed before the first anneal process, and a source/drain implant process is performed (e.g., As) using the sidewall spacers as an implantation mask. In this case, the first anneal process may be employed to concurrently activate the dopants in the source/drain regions as well as the first dopant species in the drain extension regions, and the sidewall spacers are removed before the second drain extension implant. In another implementation, the sidewall spacers are formed, the source/drain implant is performed, and the sidewall spacers are removed prior to implanting the first dopant species in the drain extensions. In this implementation, the first anneal process may again be employed to concurrently activate the dopants in the source/drain regions and the drain extension regions, after which the second drain extension implant and the second activation anneal are performed. Other alternate implementations are possible, for example, wherein a separate activation anneal is performed for the source/drain region dopants.

In another aspect of the invention, a method is provided for fabricating a MOS transistor in a wafer, comprising implanting a first dopant species into a drain extension region, and implanting a second dopant species of the same type into the drain extension region, wherein the first and second dopant species are different. The method further comprises separately activating the implanted first and second dopant species in the drain extension region, such as by performing first and second activation anneal operations, one of which is done prior to implanting the second dopant species. Yet another aspect of the invention provides active first and second dopant species throughout substantially all of the drain extension region adjacent the channel region. In still another aspect, the active first and second dopant species are of similar concentrations in the drain extension region.

To the accomplishment of the foregoing and related ends, the following description and annexed drawings set forth in detail certain illustrative aspects and implementations of the invention. These are indicative of but a few of the various ways in which the principles of the invention may be employed. Other aspects, advantages and novel features of the invention will become apparent from the following detailed description of the invention when considered in conjunction with the drawings.

DETAILED DESCRIPTION OF THE INVENTION

Figure 1:
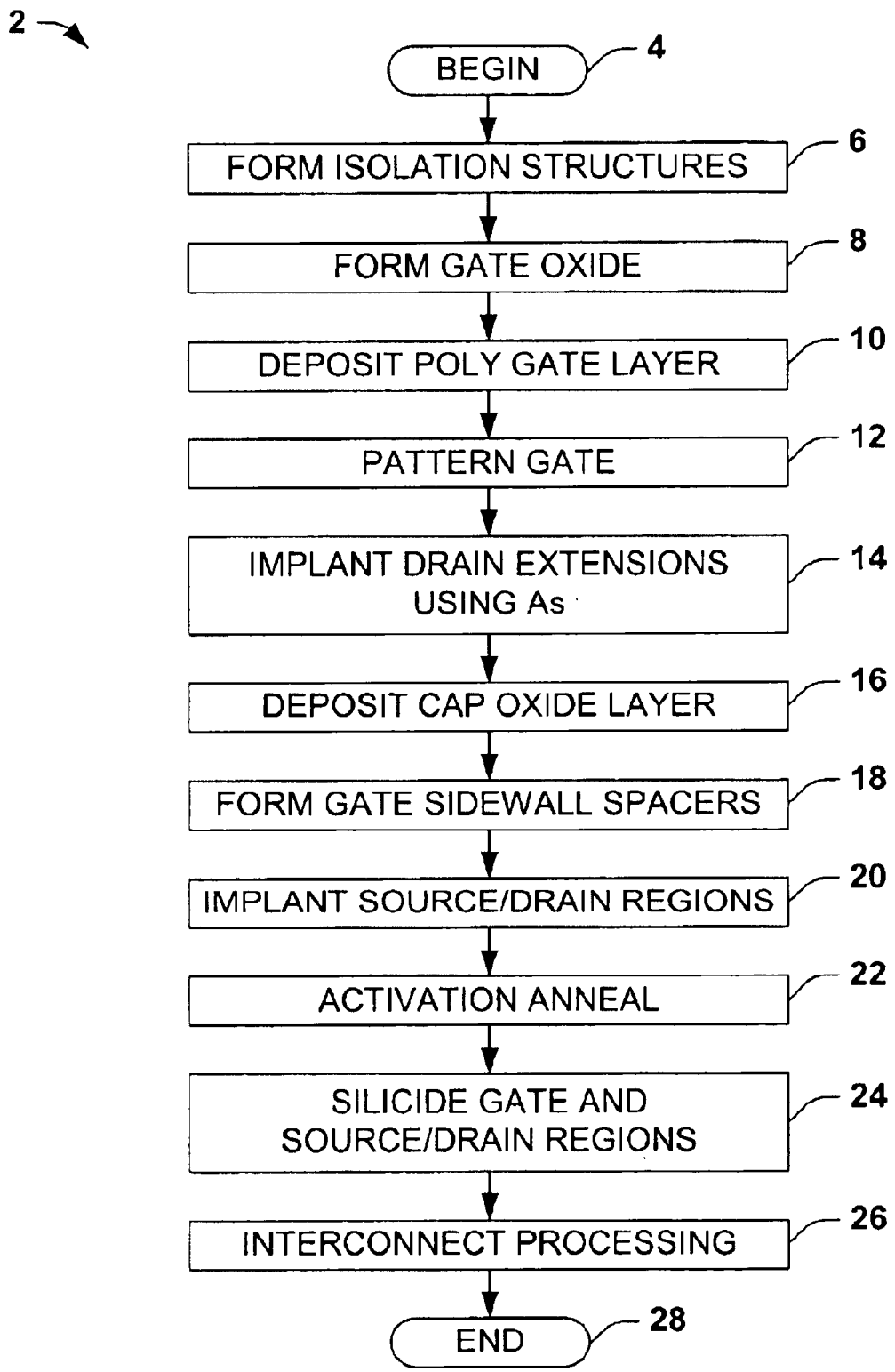
FIG. 1 is a flow diagram illustrating a conventional manufacturing process for fabricating MOS transistors having lightly doped drain (LDD) regions.

The present invention will now be described with reference to the attached drawings, wherein like reference numerals are used to refer to like elements throughout. The invention provides new processes for forming drain extension regions in the manufacture of transistor devices, wherein different first and second dopant species are separately implanted and activated in the drain extension regions to facilitate improved net activation for shallow junction depths. Exemplary implementations are hereinafter illustrated and described in the context of fabricating NMOS transistors with As and Sb drain extension dopant implantations and activations, wherein the structures illustrated are not necessarily drawn to scale. However, it will be appreciated that the invention may be employed separately or in combination in forming drain extensions in PMOS transistors using B or $BF_2$ and In, as well as in fabricating other devices apart from the exemplary structures illustrated herein.

The invention provides methods for fabricating one or more MOS transistors in a wafer, which comprise implanting a first dopant species of a first type, such as As (arsenic) into a drain extension region of the substrate adjacent the channel region, and activating the implanted first dopant using a first anneal process. A second dopant species of the first type, such as Sb (antimony) or P (phosphorus) is implanted into the drain extension region after the first anneal process using a second implantation process, and is activated using a second anneal process. The drain extension dopant species are different in accordance with one aspect of the invention, but are of the same type (e.g., n-type or p-type). Another aspect provides that the dopants are implanted and activated throughout substantially the entire drain extension region adjacent the channel, and are of similar concentrations in the drain extension region.

Figure 2A:
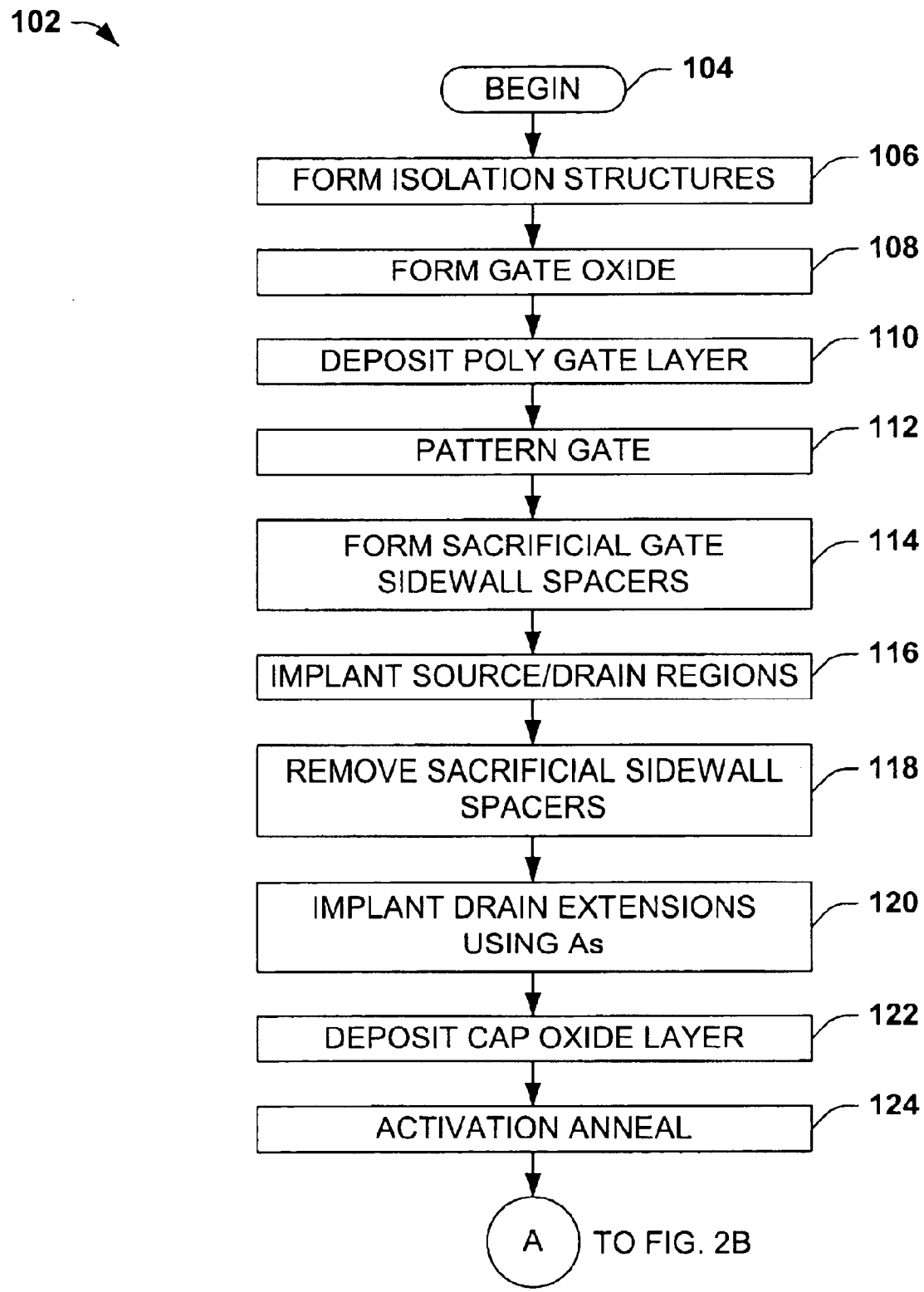
FIGS. 2A and 2B provide a flow diagram illustrating an exemplary method of fabricating MOS transistors in a wafer in accordance with one or more aspects of the present invention.
Figure 2B:
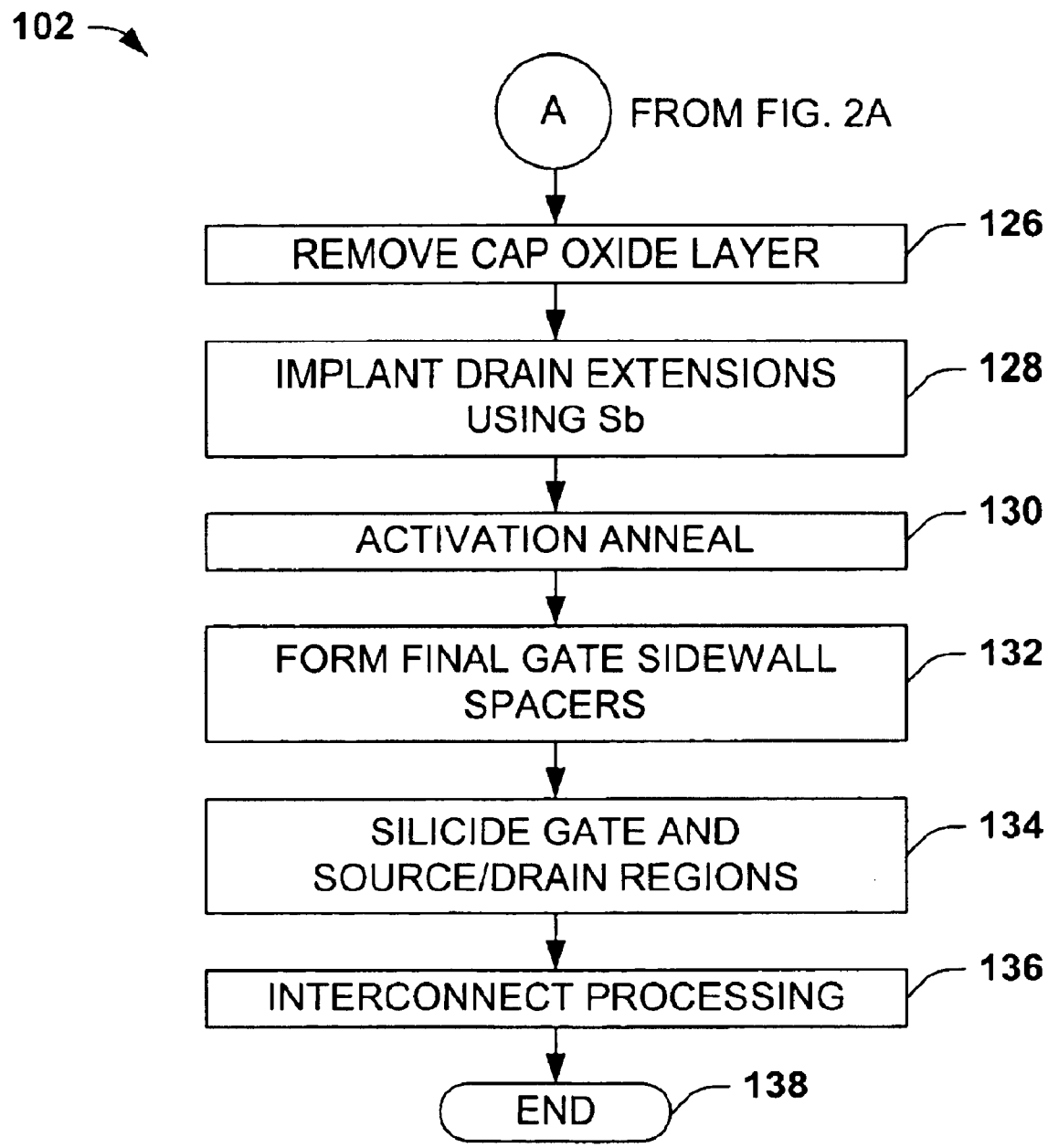

One such method 102 is illustrated in FIGS. 2A and 2B for fabricating an NMOS transistor in accordance with the invention. Although the exemplary method 102 is illustrated and described hereinafter as a series of acts or events, it will be appreciated that the present invention is not limited by the illustrated ordering of such acts or events. In this regard, some acts may occur in different orders and/or concurrently with other acts or events apart from those illustrated and/or described herein, in accordance with the invention. In addition, not all illustrated steps may be required to implement a methodology in accordance with the present invention. It is further noted that the methods according to the present invention may be implemented in association with the wafers and transistor devices illustrated and described herein as well as in association with other apparatus and structures not illustrated.

Beginning at 104, isolation structures are formed in a wafer substrate at 106, for example, using LOCOS, STI, or other isolation processes as are known. At 108, a gate oxide film is formed, such as by thermal oxidation in an oxygen-containing ambient to form a gate oxide film to a thickness of about 15 Å, although any appropriate process or thickness may be used in accordance with the invention. A layer of polysilicon is deposited, for example, to a thickness of about 1200 Å at 110, and patterned at 112 to form a gate structure, using any appropriate gate formation techniques. For instance, a photoresist film may be deposited and patterned at 112 using known photolithographic exposure processing steps, with exposed or unexposed portions thereof being removed, depending upon whether the resist is positive or negative. The remaining resist is left covering the prospective gate structure, wherein an etch process is used to remove the exposed polysilicon, leaving the desired gate structure.

In the exemplary method 102, sidewall spacer structures are then formed at 114 along the sidewalls of the patterned gate, using any appropriate spacer materials (e.g., SiN, $SiO_2$, or combinations thereof) and spacer formation techniques as are known. For example, a layer of spacer material may be deposited over the wafer and subsequently etched back at 114, leaving spacer material only along the gate sidewalls, such as through a generally anisotropic dry etch process. The spacers are temporary or sacrificial, for use in forming source/drain regions spaced in the substrate from the channel underlying the gate structure. The widths of the spacers may be adjusted accordingly to accommodate any desired lateral source/drain spacing, such as about 500–900 Å.

The source/drain regions of the substrate are then implanted at 116, using the gate structure, the gate sidewall spacers, and isolation structures as an implantation mask. In the illustrated example, As dopants are implanted at 116 to a depth of about 1200–1500 Å, however, any appropriate implantation processing may be employed at 116 to provide dopants in the source/drain regions. The sacrificial sidewall spacers are then removed at 118, such as through wet or dry etching, so as to leave substantially the entire drain extension regions exposed, including the portions thereof proximate or adjacent to the gate structure and the channel region.

At 120, a first drain extension implantation process is performed to provide As dopants to the drain extension regions of the substrate, wherein the gate structure provides an implantation mask. Prior to the first drain extension implantation, optional drain extension offset spacers may be formed for drain extension optimization. In either case, dopants are generally not provided at 120 in the substrate channel region directly below the gate structure where the first implantation process is generally normal to the substrate surface. However, angled implants may be provided at 120 in accordance with the invention, wherein some As dopants may be implanted beneath the gate, in which case the drain extension regions formed thereby may extend laterally a certain distance inward from the edges of the gate structure. Furthermore, although illustrated as implanting As as the first dopant species, other dopants may be employed at 120 within the scope of the invention. For example, in fabricating PMOS transistors, a first drain extension implant may employ B (boron), $BF_2$ (boron difluoride), or other p-type species.

In the illustrated implementation, As is implanted at 120, and accordingly, a cap oxide layer (e.g., $SiO_2$) is formed at 122. The cap oxide layer at 122 helps prevent migration of As out of the silicon substrate during subsequent activation annealing, and may be formed to any appropriate thickness, such as about 20–100 Å. In the present example, the first drain extension implant at 120 is done to a depth of about 100 Å, wherein subsequent annealing provides migration or diffusion of implanted As to a final drain extension junction depth of about 200 Å. However, the invention may be employed in forming drain extension regions to any desired junction depth. The exemplary first implantation process at 120 comprises an implantation dose of about 5E13 to 5E15 $cm^{-2}$, such as about 8E13 to 1.5E15 $cm^{-2}$, preferably about 2E14 $cm^{-2}$. The first drain extension implant at 120, moreover, employs an implantation energy of about 100 eV to about 5 keV, such as about 1–2 keV, preferably about 2 keV.

Following implantation, the As atoms occupy interstitial positions in the substrate lattice in the drain extension region (e.g., as well as in the source/drain regions), and are then activated through annealing. At 124, a first activation anneal process is performed, which concurrently activates the implanted As dopants in the source/drain regions and those in the drain extension regions, although other processes are contemplated with the scope of the present invention, wherein a separate activation may be performed for the source/drain regions. Further, the anneal at 124 provides migration or diffusion of implanted As to a final drain extension junction depth of about 200 Å in the illustrated implementation, wherein the cap oxide layer of step 122 operates to mitigate migration of As out of the silicon substrate. The first anneal process at 124 comprises annealing the wafer at about 1000 to about 1100 degrees C., preferably about 1050 degrees C.

This thermal anneal at 124 operates to activate the implanted As atoms in the drain extension region by transfer thereof from interstitial positions in the substrate lattice to substitutional sites, by which the As dopants become electrically active. This thermal activation at 124 process may be performed, for example, in an inert ambient such as N (nitrogen) and/or Ar (argon), at a peak temperature for about 200 ms or less, such as about 100–200 ms, although any appropriate time-temperature anneal process characteristic may be employed. In one implementation, the first anneal process is carried out for about 100 to 200 ms with the process controls system controlling the temperature to reach a peak temperature, and to decrease the temperature upon reaching the peak value, which may be referred to as a spike.

The activation anneal 124 also causes diffusion of implanted As downward and laterally in the substrate, wherein the effective channel length become less than the physical channel length. Thus, in the illustrated example, the drain extension regions may extend laterally under the gate structure to a distance of about 10–80 Å, and downward to a final drain extension junction depth of about 200 Å after the anneal at 124. Although the various aspects of the invention are illustrated and described in association with one or more exemplary structures in which the final drain extension junction depth is about 200 Å, it will be appreciated that other implementations are contemplated as falling within the scope of the invention and the appended claims. For example, the junction depth dimensions may be scaled to be more or less than 200 Å in accordance with the present invention.

It will be appreciated that the implantations and anneals of the illustrated example, as well as others in accordance with the invention, may provide profiled dopant concentrations, wherein peak concentrations occur at a certain depth, and where lower concentrations are found at other depths within the drain extension regions. Thus, the peak concentration depth may, but need not coincide with the maximum depth of implanted/diffused dopants within the drain extension regions. Further, while various implementations of the invention provide for generally similar concentrations of different dopant species within the drain extension regions, these concentrations may both be profiled, having peak concentrations at different depths therein, as illustrated and described further below with respect to FIG. 7.

As illustrated in FIGS. 2A and 2B, the method 102 proceeds to 126, where the cap oxide layer may optionally be removed, such as using any appropriate wet or dry etch process. Thereafter at 128, a second drain extension implantation process is performed to implant a second, different n-type dopant species, such as Sb or P into the drain extension regions. In the illustrated implementation, Sb is implanted using an implantation dose of about 5E12 to about 1E15 cm$^{-2}$, such as about 3E13 cm$^{-2}$, and an implantation energy of about 1 keV to about 15 keV, such as about 10 keV. In this example, the Sb dopants are implanted to a depth of about 200 Å, although any desired implantation depth and profile may be achieved. It is noted that in implementations involving PMOS transistors having B or $BF_2$ as a first extension implant species, the second drain extension implant at 128 (as with the first implant at 120 above) may employ various p-type dopants, such as In (indium).

A second activation anneal process is performed at 130, in order to activate the second implanted dopant species. In this example, the Sb implanted in the drain extensions has an activation characteristic somewhat different from that of As. Thus, the exemplary second anneal at 130 is performed at a lower temperature than the first anneal at 124, for example, about 950 degrees C. at a peak temperature for about 1000 ms or less, such as about 100–1000 ms. It is noted that where a different second dopant species is employed (e.g., phosphorus), the second anneal parameters at 130 may be tailored accordingly, in order to activate the second species.

The implantation of the Sb dopants at 128 after the higher temperature first anneal at 124, moreover, advantageously avoids precipitation/deactivation of Sb which may result when Sb is annealed at 1050 degrees C. As with the first anneal at 124 above, the second anneal at 130 may be performed using quick temperature spikes, such as using rapid thermal annealing (RTA) equipment, or may comprise any appropriate time-temperature anneal process characteristic. For instance, the second anneal may be performed at 130 using a peak temperature higher than 950 degrees C. for a very short duration (e.g., a few ms or less), while still avoiding or mitigating deactivation of the Sb dopants. In one example, the second drain extension anneal at 130 can be performed at about 1050 degrees C. for about 100 ms or less, such as about 0.1 to 100 ms. Furthermore, lower temperatures may be employed at 130 for longer durations. For example, the second anneal at 130 may be performed at about 800 degrees C. for about 10 minutes or less, such as about 1–10 minutes, or alternatively at about 600 degrees C. for about 30 minutes or less, such as about 10–30 minutes. Many variants are possible for the second anneal of the Sb dopants, wherein if the second anneal temperature is higher, the allowed anneal duration will be lower within the scope of the invention.

In this manner, the first and second anneals at 124 and 130 provide active first and second dopant species (e.g., As and Sb) throughout substantially all of the drain extension region adjacent the channel region, through separate activation anneals. The exemplary process 102 also provides the ability to achieve substantially similar concentrations in the drain extension regions following the second activation anneal at 130. Thereafter, final gate sidewall spacers are formed at 132 for use in a silicide process at 134 to form conductive silicide metal contacts over the gate and source/drain regions via a self-aligned silicide (salicide) process. A single or multi-layer interconnect structure is then formed at 136 to interconnect the MOS transistor gate and source/drain terminals with other electrical devices in the wafer before the exemplary method 102 ends at 138.

Figure 3A:
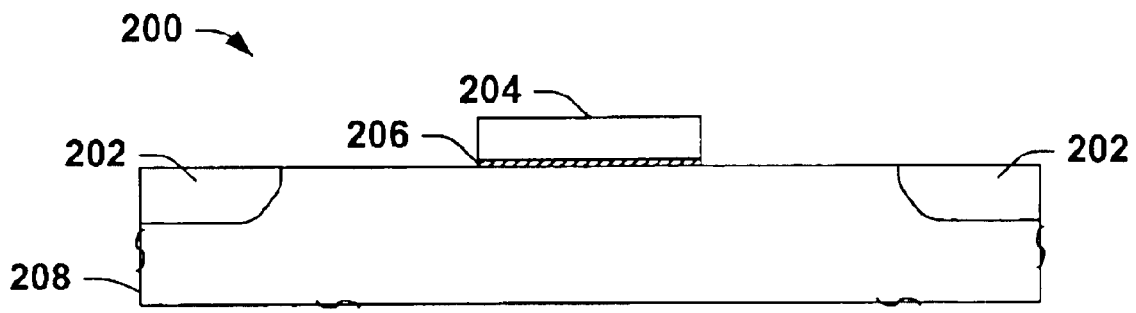
FIG. 3A is a partial side elevation view in section illustrating an exemplary NMOS transistor at an intermediate stage of processing following formation of isolation structures and a patterned gate structure overlying a gate oxide.
Figure 3B:
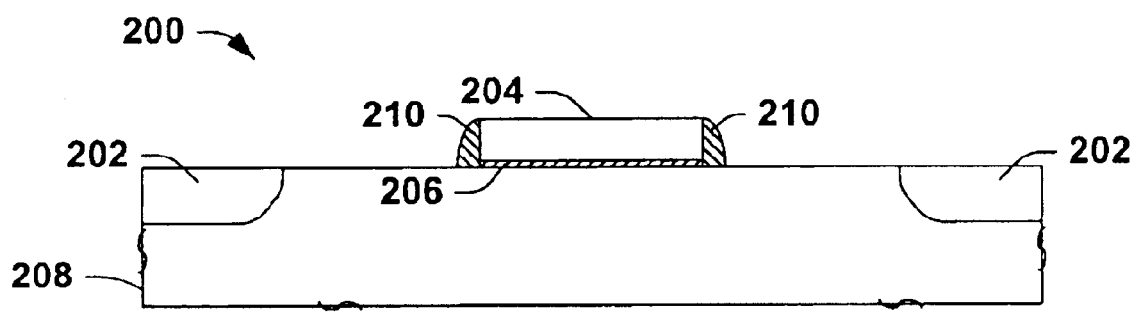
FIG. 3B is a partial side elevation view in section illustrating formation of sacrificial or temporary gate sidewall spacers in the transistor of FIG. 3A.
Figure 3C:
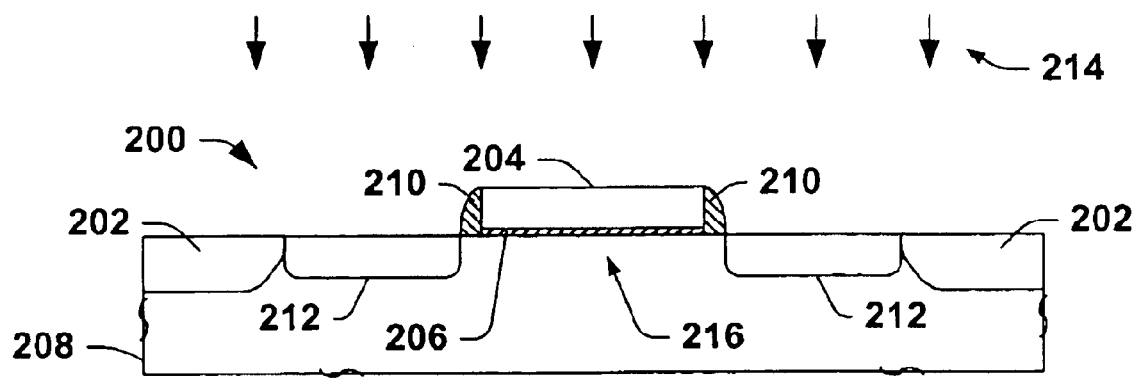
FIG. 3C is a partial side elevation view in section illustrating implantation of source/drain regions with As in the transistor of FIGS. 3A and 3B.

Referring now to FIGS. 3A–3K, an exemplary NMOS transistor 200 is illustrated undergoing fabrication processing in accordance with the invention, wherein the device 200 is not necessarily drawn to scale. In FIG. 3A, the transistor device 200 is illustrated at an intermediate stage of processing following formation of isolation structures 202 and a patterned gate structure 204 overlying a gate oxide 206 in a substrate 208, generally in accordance with the exemplary method 102 (steps 106–112) illustrated and described above. Sacrificial or temporary gate sidewall spacers 210 are formed along the sidewalls of the gate structure 204 in FIG. 3B (e.g., step 114 above) having widths of about 500–900 Å. In FIG. 3C, source/drain regions 212 are implanted with As (e.g., 116 of method 102) to a depth of about 1200–1500 Å via an implantation process 214, thereby defining a channel region 216 therebetween in the substrate 208 under the gate 204. It is noted at this point that the various structural dimensions of the sidewall spacers 210, the gate 204, and other structures, as well as those of implanted/diffused regions, are exemplary in nature, and that the invention is not limited to the structures or dimensions illustrated and described herein.

Figure 3D:
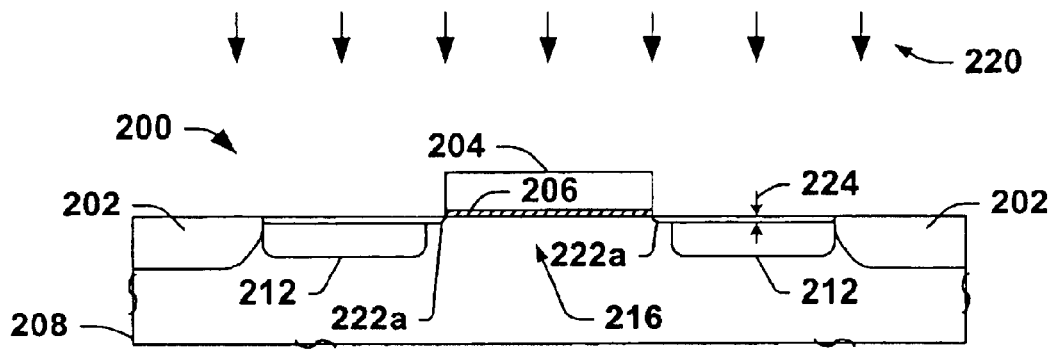
FIG. 3D is a partial side elevation view in section illustrating the device of FIGS. 3A–3C with the sacrificial sidewall spacers removed, undergoing a first drain extension implantation process to implant As in the drain extension regions in accordance with an aspect of the invention.
Figure 3E:
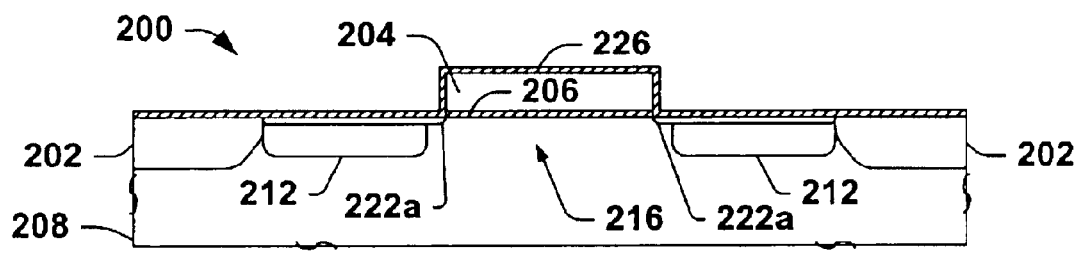
FIG. 3E is a partial side elevation view in section illustrating formation of a cap oxide layer over the transistor of FIG. 3D.
Figure 3F:
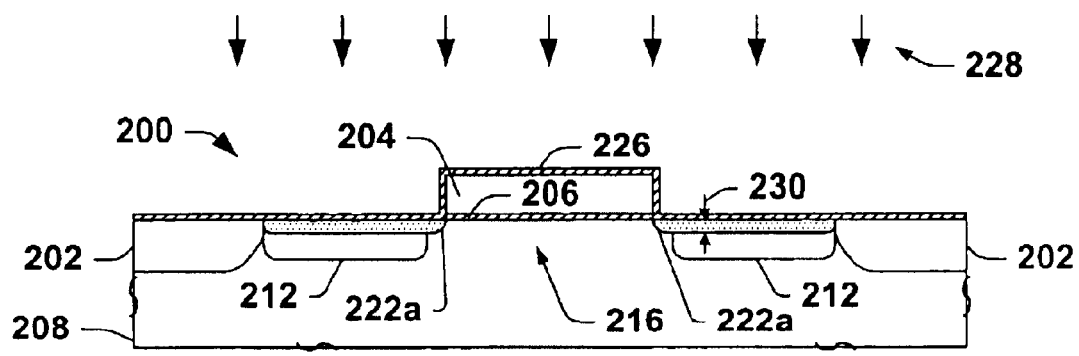
FIG. 3F is a partial side elevation view in section illustrating activation of the As in the drain extension regions, as well as concurrent activation of the source/drain region As using a first anneal process in the transistor of FIG. 3E in accordance with the invention.

Thereafter, the sacrificial sidewall spacers 210 are removed (e.g., 118 of method 102), as illustrated in FIG. 3D, and a first drain extension implantation process 220 is employed (e.g., 120 of method 102) to implant a first n-type dopant species (As) in drain extension regions 222a of the substrate 208 adjacent the channel 216. The As is implanted to an initial depth 224 of about 100 Å in the illustrated example, and may have a concentration profile, although any implantation depth and/or profile may be used in accordance with the invention. In FIG. 3E, a cap oxide layer 226 is formed over the drain extension regions 222a and the gate 204 (e.g., 122 of method 102), and a first anneal process 228 is performed in FIG. 3F (e.g., 124 of method 102) to concurrently activate implanted As in the drain extension regions 222a as well as in the source/drain regions 212. The anneal 228 may also diffuse implanted As to a depth 230 of about 200 Å in the drain extension regions 222a, as well as laterally diffusing As under the gate 204, for instance, to a distance of about 10–80 Å, although the invention is not limited to the illustrated implantation or diffusion depths or distances.

Figure 3G:
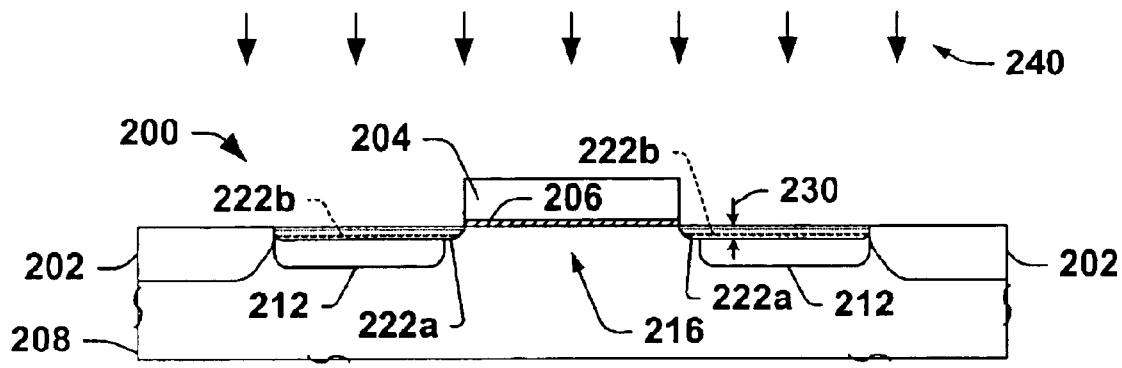
FIG. 3G is a partial side elevation view in section illustrating removal of the cap oxide layer and a second implantation process providing Sb to the drain extension regions in the transistor of FIG. 3F according to the invention.
Figure 3H:
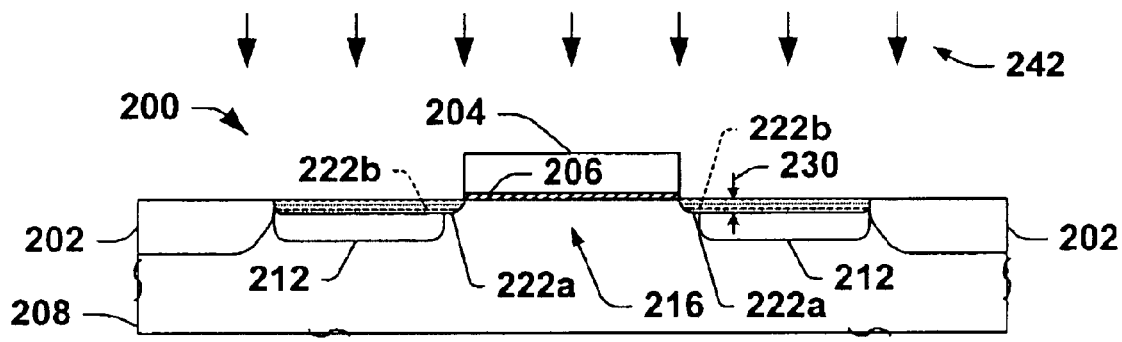
FIG. 3H is a partial side elevation view in section illustrating the transistor of FIG. 3G undergoing a second anneal process to activate the implanted Sb in the drain extension regions according to the invention.
Figure 3I:
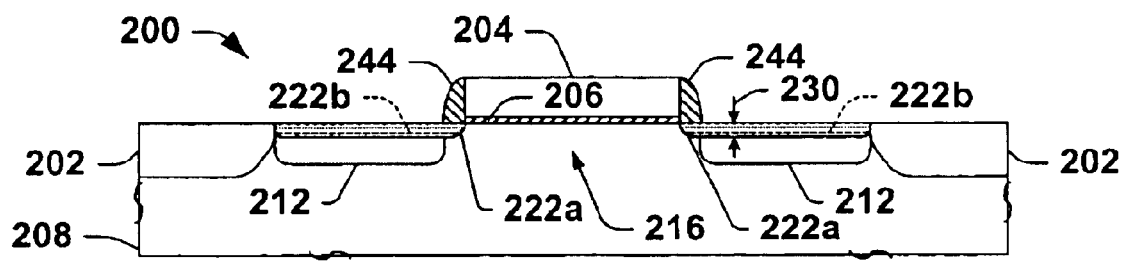
FIG. 3I is a partial side elevation view in section illustrating formation of final sidewall spacers in the transistor of FIG. 3H.

The cap oxide layer 226 may then optionally be removed (e.g., 126 of method 102), as illustrated in FIG. 3G, and a second implantation process 240 is performed (e.g., 128 of method 102) to implant Sb to drain extension regions 222b to a depth 230 of about 200 Å. Although illustrated as generally coextensive in depth with the diffused As in extension region 222a, the region 222b of implanted Sb may but need not extend to the same depth 230, and may alternatively be deeper or shallower than the implanted and diffused As. At this point, the As in the drain extensions 222a has been activated, but the implanted Sb atoms occupy interstitial positions in the lattice of the substrate 208, and must be activated (e.g., transferred to substitutional sites). A second anneal process 242 is accordingly performed in FIG. 3H (e.g., 130 of method 102) to activate the implanted Sb in the drain extension regions 222a, wherein the Sb diffuses much less than the As, whereby the junction depth 230 of the regions 222 remains at about 200 Å. Final sidewall spacers 244 are then formed in FIG. 3I (e.g., 132 of method 102) along the sidewalls of the gate structure 204 and the gate oxide 206 for use in subsequent silicide processing.

Figure 3J:
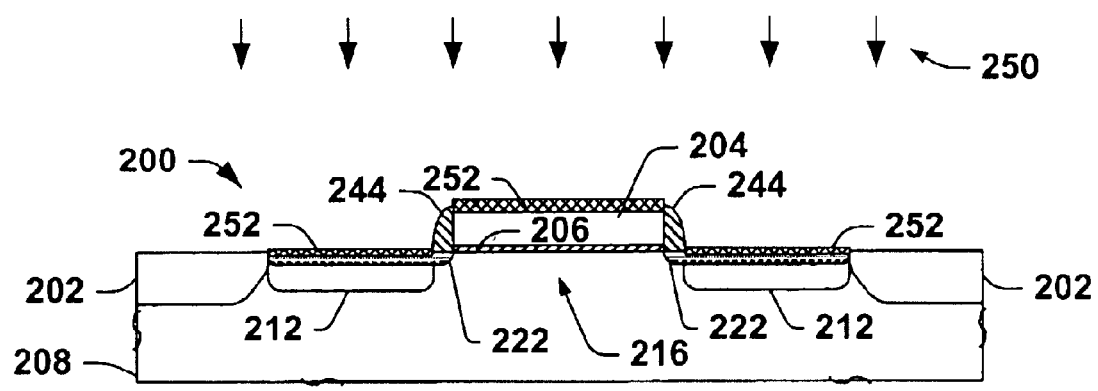
FIG. 3J is a partial side elevation view in section illustrating the transistor of FIG. 3I undergoing a silicide process to form silicide contacts on the gate and source/drain regions.
Figure 3K:
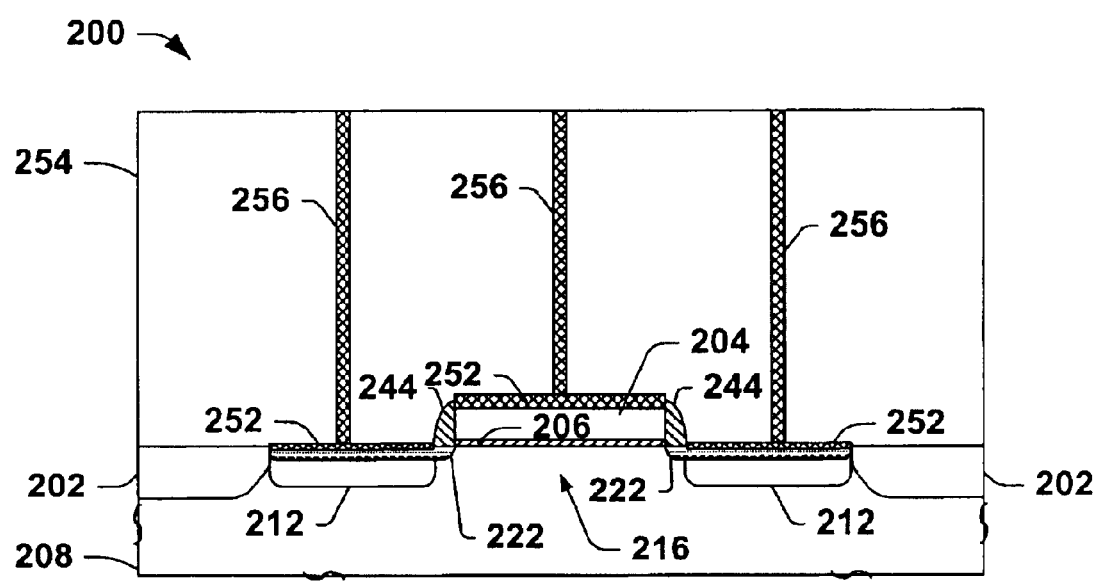
FIG. 3K is a partial side elevation view in section illustrating a first interconnect layer for interconnecting the gate and source/drain regions of the transistor of FIG. 3J.

Thereafter in FIG. 3J, the transistor device 200 undergoes a silicide process 250 (e.g., 134 of method 102) to form silicide contacts 252 on the gate 204 and source/drain regions 212. An initial interconnect layer 254 (e.g., ILD0) is then formed in FIG. 3K (e.g., 136 of method 102) over the device 200 and conductive contacts 256 are formed through the layer 254 to connect with the silicide contacts 252 at the gate 204 and source/drains 212 for interconnection of the transistor 200 with other devices in the wafer. Further interconnect structures (not shown) are thereafter formed according to interconnect processing techniques as are known.

Figure 4A:
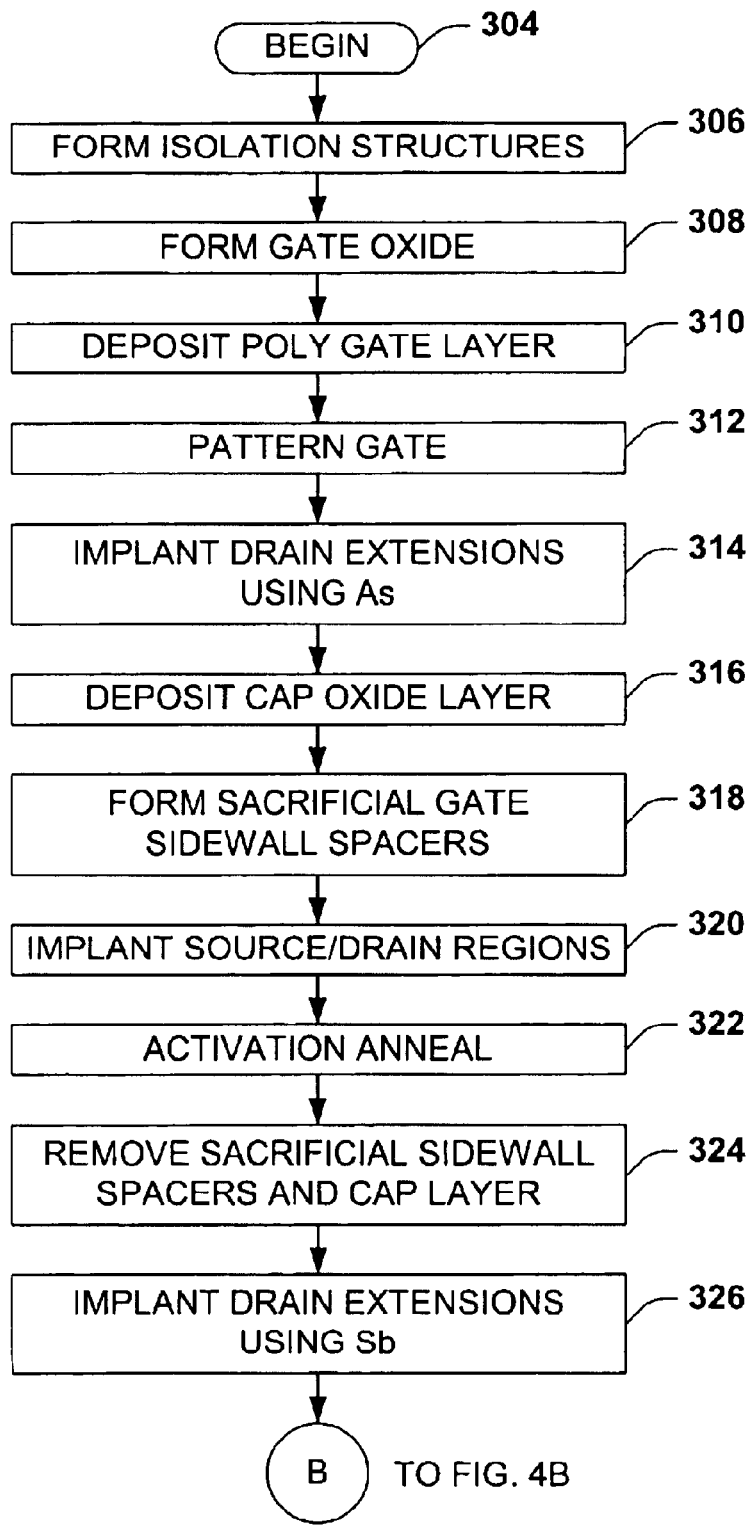
FIGS. 4A and 4B provide a flow diagram illustrating another exemplary method of fabricating MOS transistors in a wafer in accordance with the invention.
Figure 4B:
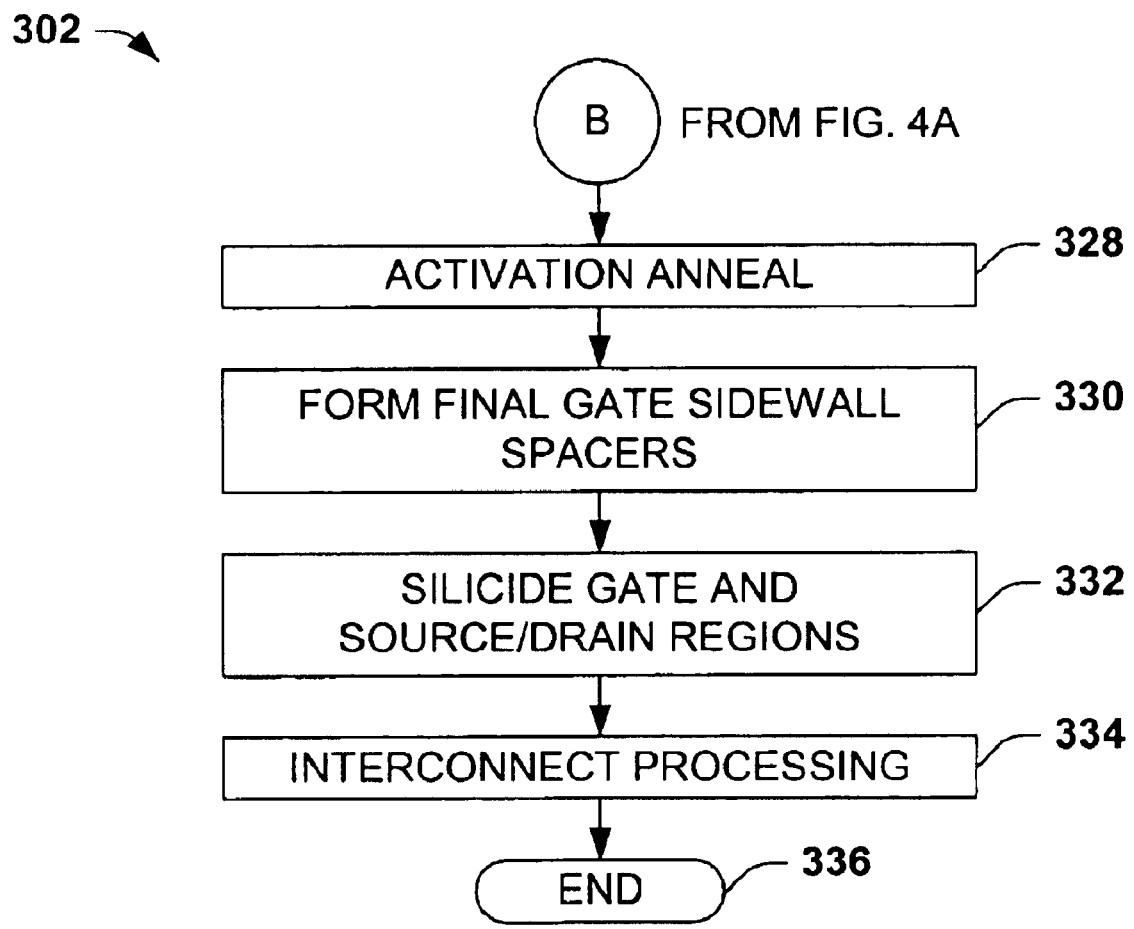

Referring now to FIGS. 4A and 4B, an alternative implementation of the invention is provided by an exemplary method 302 for fabricating MOS transistors. As with the above method 102, the method 302 is illustrated and described hereinafter as a series of acts or events. However, it will be appreciated that the present invention is not limited by the illustrated ordering of such acts or events, wherein some acts may occur in different orders and/or concurrently with other acts or events apart from those illustrated and/or described herein, in accordance with the invention. In addition, not all illustrated steps may be required to implement a methodology in accordance with the present invention. It is further noted that the methods according to the present invention may be implemented in association with the wafers and systems illustrated and described herein as well as in association with other systems and structures not illustrated.

Beginning at 304, isolation structures are formed in a wafer substrate at 306 and a gate oxide film is formed at 308. At 310, a layer of polysilicon is deposited, which is then patterned at 312 to form a gate structure. Unlike the method 102 above, the first drain extension implant is performed at 314 prior to formation of sidewall spacers and the source/drain implant. This implantation provides As dopants to the drain extension regions of the substrate with the gate structure operating as an implantation mask, in similar fashion to the first As implant at 120 of method 102 above. Thus, for instance, the drain extension implantation at 314 may provide dopants other than As (e.g., B, $BF_2$, or other species in the case of a PMOS transistor). In addition, the first drain extension implant at 314 may provide dopant species at an angle.

In the exemplary implantation at 314, the As dopants are implanted to a depth of about 100 Å, although any appropriate implantation depth may be achieved. As with the above implementation in method 102, the implantation process at 314 comprises an implantation dose of about 5E13 to 5E15 $cm^{-2}$, such as about 8E13 to 1.5E15 $cm^{-2}$, preferably about 2E14 $cm^{-2}$, and an implantation energy of about 100 eV to about 5 keV, such as about 1–2 keV, preferably about 2 keV.

Following the drain extension implantation at 314, a cap oxide layer is formed at 316 to mitigate or prevent As migration out of the silicon substrate during subsequent activation annealing. With the drain extensions having thus been implanted with the first dopant species, temporary or sacrificial sidewall spacers are then formed at 318 along the sidewalls of the patterned gate, for example, having a spacer width of about 500–900 Å. The source/drain regions of the substrate are then implanted with As at 320, where the gate structure, the sidewall spacers, and the isolation structures operate as an implantation mask. As in the previous example, the source/drain regions may be implanted to any desired depth, such as about 1200–1500 Å. In one alternative, the cap oxide later may be formed following the source/drain implantation at 320.

Following the source/drain implantation at 320, a first activation anneal process is performed at 322, which concurrently activates the implanted As dopants in the source/drain regions and the drain extension regions, and provides migration or diffusion of implanted As to a final drain extension junction depth of about 200 Å, although any desired depth is contemplated within the scope of the invention. During the anneal at 322, the cap oxide layer operates to mitigate migration of As out of the silicon substrate. The first anneal process at 322 comprises annealing the wafer at about 1000 to about 1100 degrees C., preferably about 1050 degrees C., and may be performed in an inert ambient such as N and/or Ar, at a peak temperature for about 200 ms or less. The sacrificial sidewall spacers and the cap oxide layer are then removed at 324, leaving substantially the entire drain extension regions exposed.

At 326, a second drain extension implantation process is performed to implant a second, different n-type dopant species, such as Sb or P into the drain extension regions. As in the second implant at 128 of method 102 above, Sb is implanted at 326 using an implantation dose of about 5E12 to about 1E15 $cm^{-2}$, such as about 3E13 $cm^{-2}$, with an implantation energy of about 1 keV to about 15 keV, such as about 10 keV, wherein the Sb dopants are implanted to a depth of about 200 Å in this example. Where a PMOS transistor is being fabricated, p-type dopants may alternatively be employed at 326, such as In.

As illustrated in FIG. 4B, the method 302 then proceeds to 328, whereat a second activation anneal process is performed to activate the As. The second activation anneal at 328 is performed at a lower temperature than the first anneal at 324, for example, about 950 degrees C. at a peak temperature for about 1000 ms or less, although higher temperatures may be employed for very short peak temperature durations, or lower temperatures may be employed for longer durations, such as those examples described above with respect to step 130 of FIG. 2B. As in the exemplary method 102 above, the lower temperature activation at 328 of the Sb prevents or mitigates Sb precipitation or deactivation, wherein the higher temperature As activation anneal at 322 is done prior to implanting the Sb at 326. Final gate sidewall spacers are then formed at 330 for use in a silicide process at 332 to form conductive silicide metal contacts over the gate and source/drain regions. Interconnect processing is thereafter performed at 334 before the exemplary method 302 ends at 336.

Figure 5A:
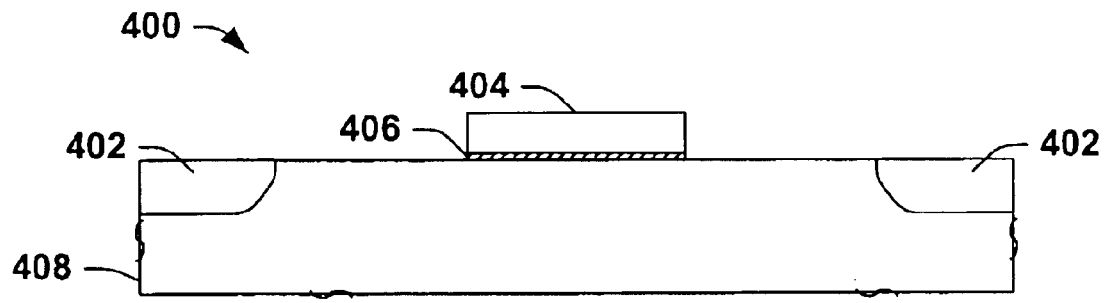
FIG. 5A is a partial side elevation view in section illustrating another exemplary NMOS transistor at an intermediate stage of processing following formation of isolation structures and a patterned gate structure overlying a gate oxide.
Figure 5B:
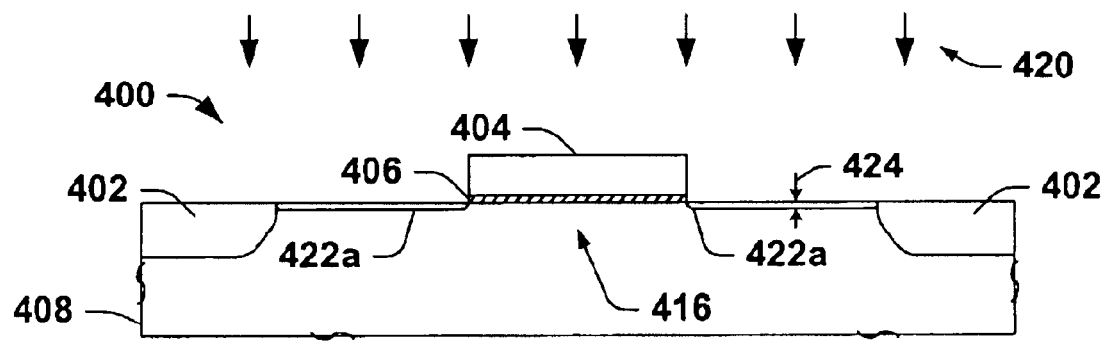
FIG. 5B is a partial side elevation view in section illustrating a first drain extension implantation process to implant As in the drain extension regions of the transistor of FIG. 5A in accordance with the invention.
Figure 5C:
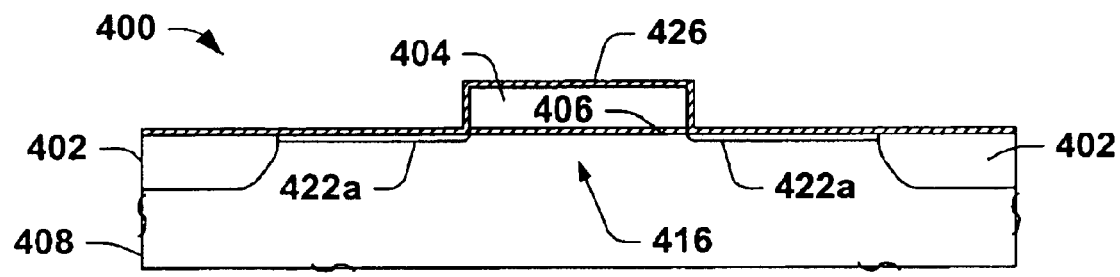
FIG. 5C is a partial side elevation view in section illustrating formation of a cap oxide layer over the transistor of FIG. 5B.

An exemplary NMOS transistor 400 is illustrated in FIGS. 5A–5I being processed in accordance with the method 302 above, wherein the device 400 is not necessarily drawn to scale. In FIG. 5A, the transistor device 400 is illustrated at an intermediate stage of processing following formation of isolation structures 402 and a patterned gate structure 404 overlying a gate oxide 406 in a substrate 408, generally in accordance with the exemplary method 302 (steps 306–312) illustrated and described above. A first drain extension implantation process 420 is performed in FIG. 5B (e.g., 314 of method 302) to implant As or other n-type dopant species in drain extension regions 422a of the substrate 408 adjacent to and defining a channel region 416 beneath the gate 404. The As is implanted to an initial depth 424 of about 100 Å in substrate 408, wherein the As will later be diffused downward and laterally during activation annealing. In FIG. 5C, a cap oxide layer 426 is formed over the drain extension regions 422a and the gate 404 (e.g., 316 of method 302).

Figure 5D:
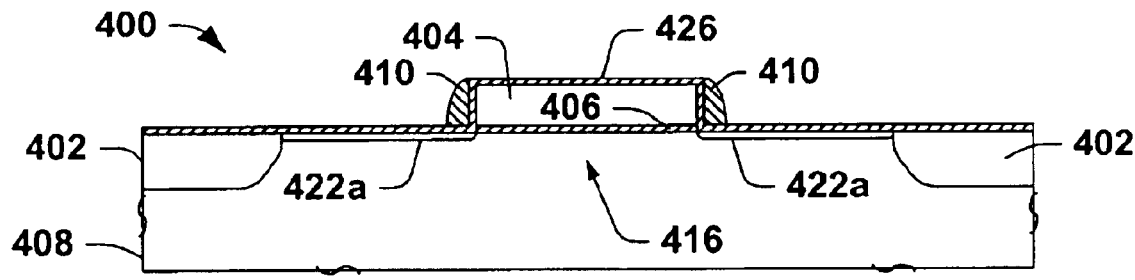
FIG. 5D is a partial side elevation view in section illustrating formation of sacrificial gate sidewall spacers in the transistor of FIG. 5C.
Figure 5E:
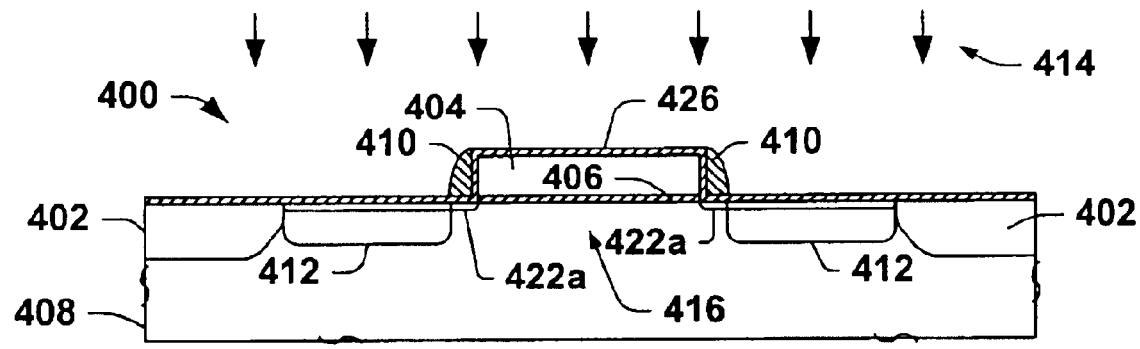
FIG. 5E is a partial side elevation view in section illustrating implantation of source/drain regions with As in the transistor of FIG. 5D.
Figure 5F:
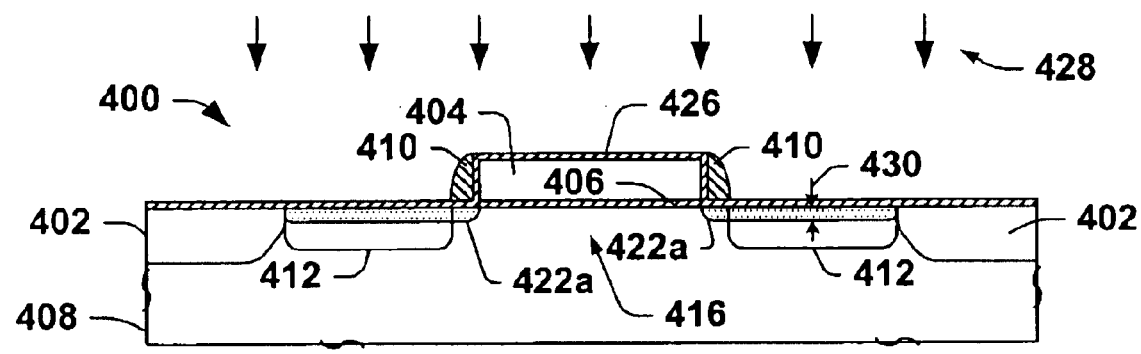
FIG. 5F is a partial side elevation view in section illustrating concurrent activation of the As in the drain extension regions and the source/drain regions using a first anneal process in the transistor of FIG. 5E in accordance with the invention.

Sacrificial sidewall spacers 410 are then formed in FIG. 5D along the sidewalls of the gate structure 404 (e.g., 318 above) having widths of about 500–900 Å. In FIG. 5E, source/drain regions 412 are implanted with As (e.g., 320 of method 302) to a depth of about 1200–1500 Å via an implantation process 414, wherein the spacers 410, the gate 404, and the isolation structures 402 operate as an implantation mask. In this manner, the source/drain regions 412 are laterally spaced from the channel 416 by a distance roughly equal to the width of the sidewall spacers 410, wherein the source/drain and drain extension regions 412 and 422a, respectively, partially overlap one another. A first drain extension anneal process 428 is performed in FIG. 5F (e.g., 322 of method 302) to concurrently activate implanted As in the drain extension regions 422a as well as in the source/drain regions 412. The process 428 also diffuses implanted As to a depth 430 of about 200 Å in the drain extension regions 422a, as well as laterally diffusing As under the gate 404, for instance, to a distance of about 10–80 Å.

Figure 5G:
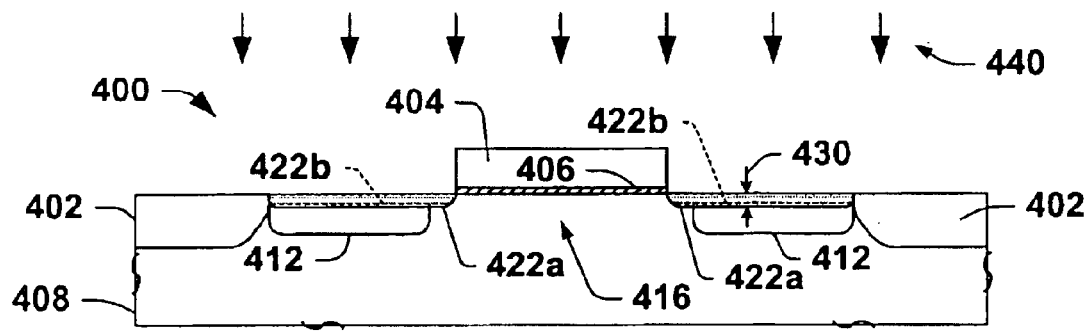
FIG. 5G is a partial side elevation view in section illustrating the device of FIG. 5F undergoing a second drain extension implantation process to implant Sb in the drain extension regions following removal of the sacrificial sidewall spacers in accordance with the invention.
Figure 5H:
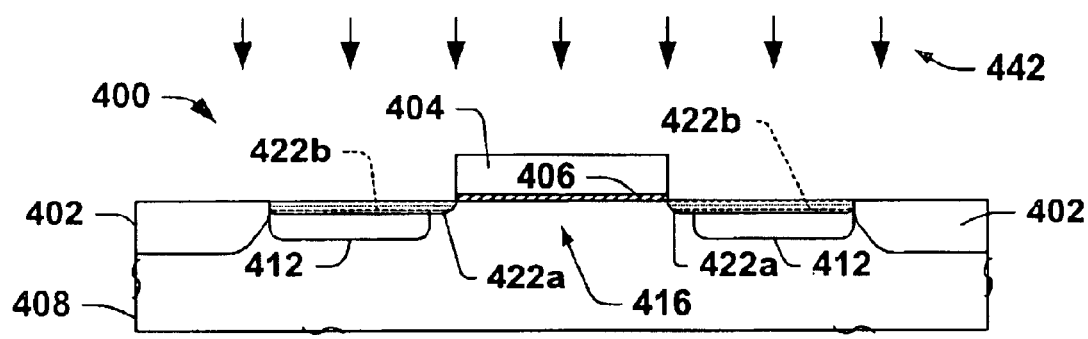
FIG. 5H is a partial side elevation view in section illustrating the transistor of FIG. 5G undergoing a second anneal process to activate the implanted Sb in the drain extension regions according to the invention.
Figure 5I:
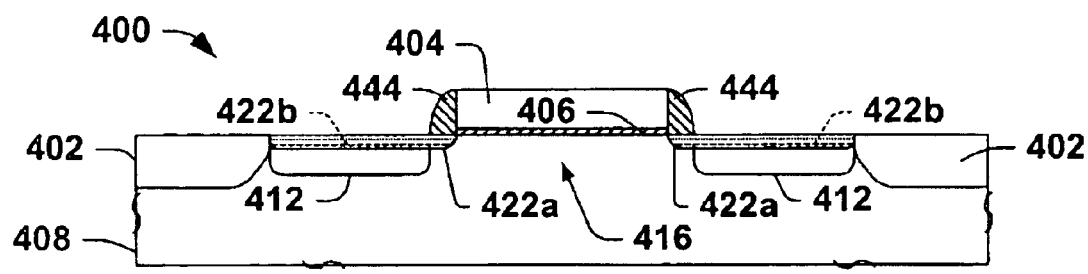
FIG. 5I is a partial side elevation view in section illustrating formation of final sidewall spacers in the transistor of FIG. 5H.

Thereafter in FIG. 5G, the sacrificial sidewall spacers 410 and the cap oxide layer 426 are removed (e.g., 324 of method 302), and a second implantation process 440 is performed (e.g., 326 of method 302) to implant Sb into the drain extension regions 422b to a depth 430 of about 200 Å. Although illustrated as generally coextensive in depth with the diffused As in extension region 422a, the region 422b of implanted Sb may but need not extend to the same depth 430, and may alternatively be deeper or shallower than the implanted and diffused As. At this point, the As in the drain extensions 422a has been activated, but the implanted Sb in region 422b has not. Accordingly, a second anneal process 442 is employed in FIG. 5H (e.g., 328 of method 302) to activate the implanted Sb in the drain extension regions 422b. Final sidewall spacers 444 are then formed in FIG. 5I (e.g., 330 of method 302) along the sidewalls of the gate structure 404, after which silicide and interconnect processing may be performed (not shown).

It will be noted that the devices 200 and 400 illustrated and described above, as well as the methods 102 and 302 are exemplary in nature, and that many alternative orderings of various process steps may be made in accordance with the spirit and scope of the present invention. In addition, as pointed out above, the invention is not limited to NMOS device fabrication, and may be implemented in association with fabricating PMOS transistors as well. Moreover, the invention finds utility in association with the manufacture of memory devices, wherein the various aspects thereof may be applied in fabricating memory cells and the like.

Figure 6:
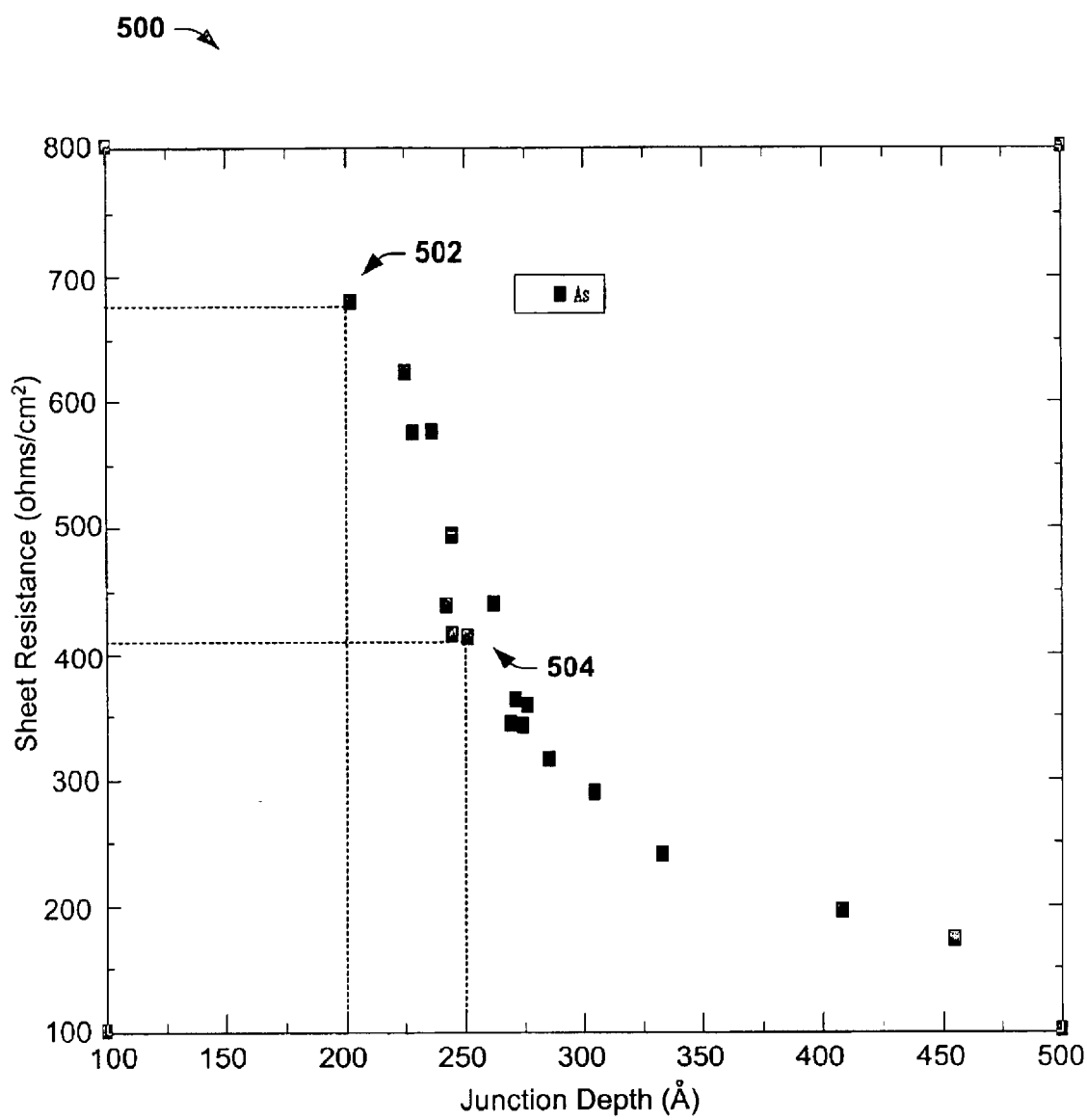
FIG. 6 is a plot illustrating sheet resistance vs. junction depth for an As-only drain extension process.
Figure 7:
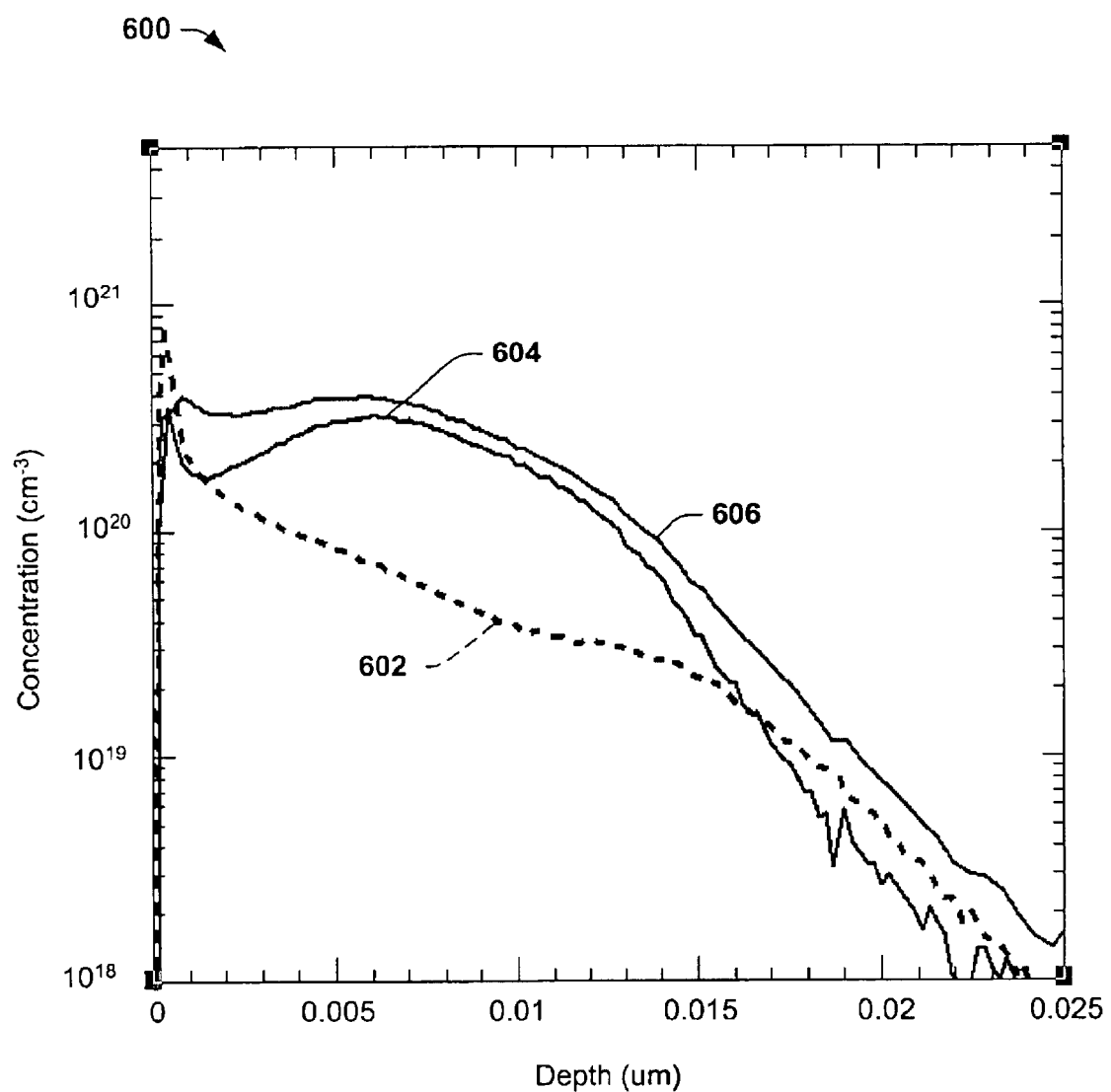
FIG. 7 is a plot illustrating dopant concentration vs. junction depth for As, Sb, and for total dopants in a transistor drain extension region processed in accordance with the invention.
Figure 8:
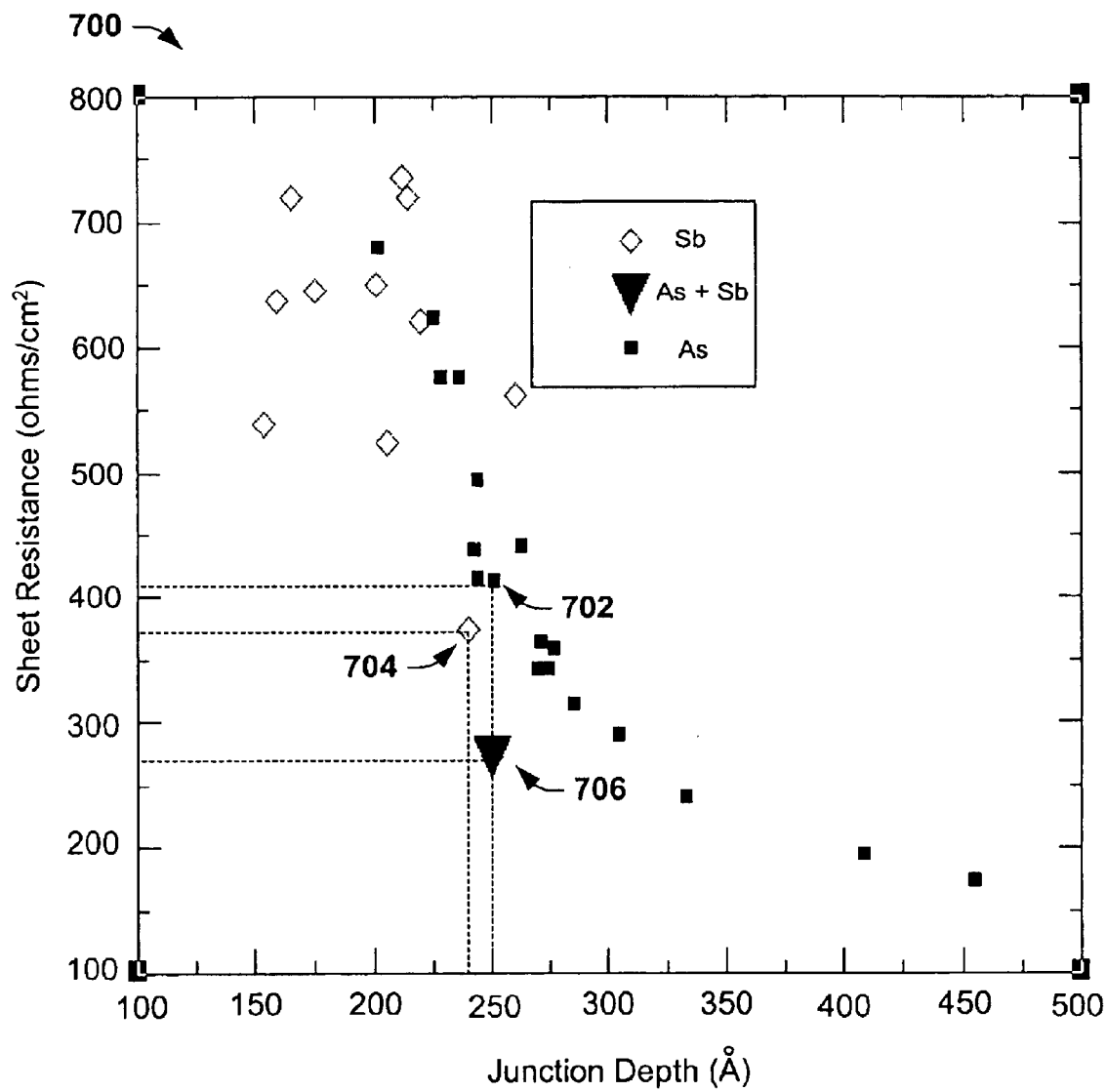
FIG. 8 is a plot illustrating sheet resistance vs. junction depth for drain extension regions fabricated using and As-only process, an Sb-only process, and for a drain extension region processed in accordance with the invention.

Referring now to FIGS. 6–8, plots are presented to illustrate the impact of the present invention as applied to an exemplary NMOS device (e.g., such as the devices 200 and 400 illustrated above). FIG. 6 provides a plot 500 illustrating sheet resistance vs. junction depth for a single-step drain extension process using As-only, such as an NMOS device fabricated generally per the conventional method illustrated in FIG. 1. It is noted in the plot 500 that for a drain extension junction depth of about 200 Å at point 502, the sheet resistance of the As only process is about 675 ohms/square, and for a junction depth of 250 Å, the sheet resistance is slightly over 400 ohms/square at point 504.

Using separate implantation and activation of different dopant species of the same type (e.g., n-type As and Sb), the present invention provides for improved net dopant activation and corresponding reduction in sheet resistance compared with the conventional technique of FIGS. 1 and 6. FIG. 7 shows a plot 600 illustrating active dopant concentration ($cm^{-3}$) vs. junction depth (um) following the second anneal for As, Sb, and for total dopants in a transistor drain extension region processed in accordance with the invention. The As concentration is illustrated as a curve 602, the Sb concentration is shown as a curve 604, and the net concentration of active n-type dopants (e.g., As and Sb) is shown as a curve 606. As can be seen in the plot 600, the concentrations of As and Sb are substantially similar throughout the drain extension region, wherein the two individual concentrations are within one order of magnitude at any given depth therein. Referring also to FIG. 8, a plot 700 illustrates sheet resistance vs. junction depth for drain extension regions processed using As-only (rectangles 702), Sb-only (diamonds 704), and for a drain extension region processed in accordance with the invention (triangle 706).

As can be seen from the plot 700, for a drain extension junction depth of about 250 Å, the As-only process (e.g., FIGS. 1 and 6 above) provides a sheet resistance over 400 ohms/square, whereas the exemplary implementation of the present invention (e.g., method 102 or 302 above) achieves a much lower sheet resistance of about 270 ohms/square. At a somewhat shallower depth, the Sb-only process yields about 370 ohms/square. Thus, it is seen that the processing techniques of the present invention provide significant advantages in reducing sheet resistance, through improved net dopant species activation, compared with conventional As-only and Sb-only processes in fabricating NMOS transistors.

Although the invention has been illustrated and described with respect to one or more implementations, equivalent alterations and modifications will occur to others skilled in the art upon the reading and understanding of this specification and the annexed drawings. In particular regard to the various functions performed by the above described components (assemblies, devices, circuits, systems, etc.), the terms (including a reference to a "means") used to describe such components are intended to correspond, unless otherwise indicated, to any component which performs the specified function of the described component (e.g., that is functionally equivalent), even though not structurally equivalent to the disclosed structure which performs the function in the herein illustrated exemplary implementations of the invention. In addition, while a particular feature of the invention may have been disclosed with respect to only one of several implementations, such feature may be combined with one or more other features of the other implementations as may be desired and advantageous for any given or particular application. Furthermore, to the extent that the terms "including", "includes", "having", "has", "with", or variants thereof are used in either the detailed description and/or the claims, such terms are intended to be inclusive in a manner similar to the term "comprising."

What is claimed is:

1. A method of fabricating a MOS transistor in a wafer, comprising:

forming a gate structure over a channel region of a substrate;

implanting a first dopant species of a first type into a drain extension region of the substrate adjacent the channel region using a first implantation process;

activating the implanted first dopant species in the drain extension region using a first anneal process;

implanting a second dopant species of the first type, different from the first dopant species, into the drain extension region after the first anneal process using a second implantation process; and activating the implanted second dopant species in the drain extension region using a second anneal process.

2. The method of claim 1, wherein implanting the first dopant species comprises implanting As in the drain extension region using the first implantation process, and wherein implanting the second dopant species comprises implanting one of Sb and P in the drain extension region using the second implantation process.

3. The method of claim 1, wherein implanting the first dopant species comprises implanting As in the drain extension region using the first implantation process, and wherein implanting the second dopant species comprises implanting Sb in the drain extension region using the second implantation process.

4. The method of claim 3, wherein the first implantation process comprises an implantation dose of about 5E13 cm$^{-2}$ or less and about 5E15 cm$^{-2}$ or less and an implantation energy of about 100 eV or more and about 5 keV or less.

5. The method of claim 4, wherein the first implantation process comprises an implantation dose of about 8E13 cm$^{-2}$ or less and about 1.5E15 cm$^{-2}$ or less and an implantation energy of about 1 keV or more and about 2 keV or less.

6. The method of claim 5, wherein the first implantation process comprises an implantation dose of about 2E14 cm$^{-2}$ and an implantation energy of about 2 keV.

7. The method of claim 4, wherein the first anneal process comprises annealing the wafer at about 1000 degrees C. or more and about 1100 degrees C. or less.

8. The method of claim 7, wherein the first anneal process comprises annealing the wafer at about 1050 degrees C.

9. The method of claim 7, wherein the first anneal process comprises annealing the wafer at peak temperature for about 200 ms or less.

10. The method of claim 7, wherein the second implantation process comprises an implantation dose of about 5E12 cm$^{-2}$ or less and about 1E15 cm$^{-2}$ or less and an implantation energy of about 1 keV or more and about 15 keV or less.

11. The method of claim 10, wherein the second implantation process comprises an implantation dose of about 3E13 cm$^{-2}$ and an implantation energy of about 10 keV.

12. The method of claim 10, wherein the second anneal process comprises annealing the wafer at about 950 degrees C.

13. The method of claim 12, wherein the second anneal process comprises annealing the wafer at peak temperature for about 1000 ms or less.

14. The method of claim 10, wherein the second anneal process comprises annealing the wafer at about 1050 degrees C. for about 100 ms or less.

15. The method of claim 10, wherein the second anneal process comprises annealing the wafer at about 800 degrees C. for about 1 minute or more and about 10 minutes or less.

16. The method of claim 10, wherein the second anneal process comprises annealing the wafer at about 600 degrees C. for about 10 minutes or more and about 30 minutes or less.

17. The method of claim 3, wherein the second implantation process comprises an implantation dose of about 5E12 cm$^{-2}$ or less and about 1E15 cm$^{-2}$ or less and an implantation energy of about 1 keV or more and about 15 keV or less.

18. The method of claim 17, wherein the second implantation process comprises an implantation dose of about 3E13 cm$^{-2}$ and an implantation energy of about 10 keV.

19. The method of claim 17, wherein the second anneal process comprises annealing the wafer at about 950 degrees C.

20. The method of claim 19, wherein the second anneal process comprises annealing the wafer at peak temperature for about 1000 ms or less.

21. The method of claim 3, further comprising:

forming sidewall spacers on opposite sidewalls of the gate structure before the first anneal process;

implanting the first dopant species into a source/drain region of the substrate spaced from the channel region using the sidewall spacers as an implantation mask; and activating the implanted first dopant species in the source/drain region using the first anneal process.

22. The method of claim 1, further comprising:

forming sidewall spacers on opposite sidewalls of the gate structure before the first anneal process;

implanting the first dopant species into a source/drain region of the substrate spaced from the channel region using the sidewall spacers as an implantation mask before the first anneal process; and activating the implanted first dopant species in the source/drain region using the first anneal process.

23. The method of claim 1, wherein implanting the first dopant species comprises implanting one of B and BF$_2$ in the drain extension region using the first implantation process, and wherein implanting the second dopant species comprises implanting In in the drain extension region using the second implantation process.

24. The method of claim 1, wherein the first and second anneal processes provide active first and second dopant species throughout substantially all of the drain extension region adjacent the channel region.

25. A method of fabricating a MOS transistor in a wafer, comprising:

forming a gate structure over a channel region of a substrate;

implanting a first dopant species of a first type into a drain extension region of the substrate adjacent the channel region;

implanting a second dopant species of the first type into the drain extension region, the first and second dopant species being different; and separately activating the implanted first and second dopant species in the drain extension region.

26. A method of fabricating a MOS transistor in a wafer, comprising:

implanting a first dopant species of a first type into a drain extension region of a substrate;

implanting a second dopant species of the first type into the drain extension region, the second dopant species being different from the first dopant species; and separately activating the implanted first and second dopant species in the drain extension region to provide active first and second dopant species throughout substantially all of the drain extension region proximate the channel region.

27. The method of claim 26, wherein active first and second dopant species are of similar concentrations in the drain extension region.

* * * * *